United States Patent
Ouchi

(10) Patent No.: US 6,261,859 B1
(45) Date of Patent: *Jul. 17, 2001

(54) METHOD FOR FABRICATING SURFACE-EMITTING SEMICONDUCTOR DEVICE, SURFACE-EMITTING SEMICONDUCTOR DEVICE FABRICATED BY THE METHOD, AND DISPLAY DEVICE USING THE DEVICE

(75) Inventor: Toshihiko Ouchi, Sagamihara (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/129,082

(22) Filed: Aug. 5, 1998

(30) Foreign Application Priority Data

| Aug. 5, 1997 | (JP) | ................................................ 9-223081 |
| Jul. 30, 1998 | (JP) | ................................................ 10-229383 |

(51) Int. Cl.⁷ .................................................... H01L 21/00
(52) U.S. Cl. .................................. 438/39; 438/40; 438/42
(58) Field of Search .................................. 438/39, 40, 42

(56) References Cited

U.S. PATENT DOCUMENTS

| 4,956,844 | * | 9/1990 | Goodhue et al. ........................ 372/44 |
| 5,029,176 | * | 7/1991 | Chang-hasnain ........................ 372/50 |
| 5,031,187 | * | 7/1991 | Orenstein et al. ....................... 372/50 |
| 5,034,344 | * | 7/1991 | Jewell et al. ............................ 372/45 |
| 5,034,958 | * | 7/1991 | Kwon et al. ............................. 372/45 |
| 5,258,990 | * | 11/1993 | Olbright et al. ........................ 372/46 |
| 5,283,447 | * | 2/1994 | Olbright et al. ........................ 257/85 |
| 5,428,634 | * | 6/1995 | Bryan et al. ............................. 372/45 |
| 5,453,405 |   | 9/1995 | Fan et al. ............................... 437/228 |
| 5,459,081 |   | 10/1995 | Kajita .................................... 437/3 |
| 5,642,376 | * | 6/1997 | Olbright et al. ........................ 372/99 |
| 5,701,325 |   | 12/1997 | Ouchi et al. ............................ 372/96 |
| 5,809,051 | * | 9/1998 | Oudar .................................... 372/45 |
| 5,877,038 | * | 3/1999 | Coldren et al. ......................... 438/39 |

FOREIGN PATENT DOCUMENTS

| 0616376 | 1/1994 | (EP) . |
| 2307791 | 6/1997 | (GB) . |
| 9-223848 | 8/1997 | (JP) . |

OTHER PUBLICATIONS

D.I. Babic et al., "Double–fused 1.52–$\mu$m vertical–cavity lasers", 1995 American Institute of Physics, Appl. Phys. Lett. 66(9), Feb. 27, 1995.

(List continued on next page.)

*Primary Examiner*—Richard Elms
*Assistant Examiner*—Michael S. Lebentritt
(74) *Attorney, Agent, or Firm*—Fitzpatrick, Cella, Harper & Scinto

(57) ABSTRACT

A surface-emitting semiconductor device is fabricated by a method comprising the steps of epitaxially growing, on a first substrate comprising a semiconductor, semiconductor layers having a semiconductor active layer capable of emitting light upon feed of an electric current; forming an electrode for feeding electric current to the semiconductor active layer; bonding the first substrate on which the semiconductor layers have been formed, to a second substrate with the former's semiconductor layer side inward; and removing the first substrate from the bonded substrates so as to leave the semiconductor layers on the second substrate.

24 Claims, 9 Drawing Sheets

OTHER PUBLICATIONS

Y. Hayashi et al., "Record low–threshold index–guided inGaAs/GaAIAs vertical–cavity surface–emitting laser with a native oxide confinement structure", Electronics Letters, 30$^{th}$ Mar. 1995, vol. 31, No. 7.

Matsuo Et Al.; "VCSEL–based smart pixels", Advanced Applications of Lasers in Materials Processing Topical Meeting, Keystone; Aug. 5–9, 1996, pp. 3–4.

Fathollahnejad H. Et Al.; "VCSELs integrated onto Si substrates by PdGe contacts", Electronics Letters; vol. 30, No. 15, Jul. 21, 1994, pp. 1235–1236.

Yeh H–J Et Al.; "Integration of GaAs VCSEL and Si by substrate removal", Applied Physics Letters; Mar. 21, 1994, vol. 64, No. 12, pp. 1466–1468.

Quan Y. Et Al.; "Low–threshold proton–implanted 1.3um VCSELs with dielectric and wafer–bonded GaAs/A1As Bragg mirrors", Photonics Technology Letters; vol. 9, No. 7, Jul. 1, 1997, pp. 866–868.

* cited by examiner

METHOD FOR FABRICATING SURFACE-EMITTING SEMICONDUCTOR DEVICE, SURFACE-EMITTING SEMICONDUCTOR DEVICE FABRICATED BY THE METHOD, AND DISPLAY DEVICE USING THE DEVICE

BACKGROUND OF THE INVENTION

1. Field of the Invention

This invention relates to a method by which a surface-emitting semiconductor device suited for two-dimensional array structure can be fabricated simply and at a high yield, a surface-emitting semiconductor device fabricated by such a method, and a display device making use of such a device.

2. Related Background Art

In recent years, two-dimensional array type surface solid-state light-emitting devices are sought to be developed so that they can be applied to large-capacity parallel light information processing, high-speed optical couplers and thin-type display devices. In order for the former to be applied to the latter, the devices are required to be inexpensive, to have a low power consumption, to have a high productivity and to have a high reliability. Materials for the surface solid-state light-emitting devices have been studied and developed in variety, and semiconductor single crystals are very suited for ensuring reliability. In particular, surface-emitting semiconductor devices making use of compound semiconductors are being developed energetically. Compound semiconductors make it possible to emit light over a wide-range wave band of from ultraviolet to infrared by changing materials for substrates and laminate structures, and are considered promising as display devices. Also, among light-emitting devices, laser diodes (LD) having light reflectors on both ends have very high light-emitting efficiency compared with natural light emission, and hence can make power consumption small even when formed in two-dimensional array. From such a viewpoint, Vertical Cavity Surface Emitting Laser (VCSEL) is actively developed in recent years.

At present, such VCSELs are also being developed first on those emitting blue light of wavelength of about 400 nm and up to those emitting light of 1.55 μm which is at a communication wave band. Researches are made on materials of, e.g., an AlGaN/InGaN system on a sapphire substrate, an InGaAlP/InAlP or InGaAs/AlGaAs system on a GaAs substrate and a InGaAs/InGaAsP system on an InP substrate.

A basic structure of a prior art VCSEL is shown in FIG. 1. It has a structure wherein laser light is vertically emitted through a substrate 201 and 99% or more highly reflective films 209 are provided on both sides of an epitaxially grown layer of several μm thick. In FIG. 1, reference numeral 202 denotes an etching stop layer; 203 and 205, clad layers; 204, an active layer; 206, a contact layer; 207, an insulating layer; 208, electrodes; and 210, a buried layer.

As the reflective films, multiple layers formed of λ/4-thick films having different refractive indexes are chiefly used. As materials therefor, dielectrics as in the example shown in FIG. 1 or epitaxially grown semiconductors are commonly used. Examples of epitaxially grown mirrors include those in which an AlAs/GaAs multi-layer film mirror, an active layer and so forth are formed on a GaAs substrate by one-time growth as disclosed in ELECTRONICS LETTERS, 31, p.560 (1995), and those in which a GaAs/AlAs mirror formed on a GaAs substrate is bonded by direct joining to a laser structure of an InGaAsP/InP system grown on an InP substrate as disclosed in APPLIED PHYSICS LETTER, 66, p.1030 (1995).

However, in the case where semiconductor epitaxial layers are used as the multi-layer film mirror, the refractive indexes can not be made so much different that many layers must be formed, which take a long growth time and give a large layer thickness, and hence a low productivity may result and the films can be worked or smoothed with difficulty. Also, in such semiconductor mirrors, a practical material is GaAs/AlAs under the existing conditions, which, however, taking account of lattice constant, may impose limitations on materials usable for the active layer, resulting in limitations on oscillation wave bands. In the case where the GaAs/AlAs mirror is bonded by direct joining, materials usable for the active layer can be selected from a broader range and the films can also be applied to other wave bands. There, however, are limitations on the size of the semiconductor substrate, and hence this method can be effective only for small-area ones.

On the other hand, the dielectric multi-layer film a=: mirror can be produced simply, but can not be formed on the substrate as it is. Hence, the films must be formed after the back of the substrate 201 is etched to make a window 201a as shown in FIG. 1, where the window is required to be formed with precision and also windows can not be made so much close to each other. Thus, the yield and uniformity are so poor that the device can not be formed in a high density, and hence there has been a problem when formed in two-dimensional array.

Meanwhile, Japanese Patent Application Laid-open No. 9-223848 discloses a method comprising epitaxially growing on a semiconductor substrate, semiconductor layers having a semiconductor active layer, bonding this semiconductor substrate to an integrated-circuit substrate, and thereafter removing the semiconductor substrate to fabricate a semiconductor device on which a surface-emitting semiconductor device and other electrical devices are integrated. A schematic cross-sectional view of this semiconductor device is shown in FIG. 2. In FIG. 2, reference numeral 500 denotes a light input-output substrate; 500A, light-receiving elements; 500B, vertical oscillator type surface-emitting lasers; 500C and 500D are each wiring for the light-receiving elements 500A and surface-emitting lasers 500B; 200, an integrated-circuit substrate; 200A, metal wiring of the integrated-circuit substrate 200; 300, an insulating layer; 400, wiring; $L_c$, output light; and $L_i$, an input light.

The semiconductor device shown in FIG. 2, however, is not a device making use of a substrate comprised of light-transmitting material so that the light is emitted from the substrate side. Also, the semiconductor device shown in FIG. 2 is provided with wiring at terraced portions at each light-emitting area, and hence has had a problem that it is difficult to form the wiring to bring about a poor yield. Especially when the dielectric multi-layer film mirror is fabricated on the semiconductor layer under the constitution shown in FIG. 2, a remarkably low yield may result.

SUMMARY OF THE INVENTION

An object of the present invention is to solve the problems in the above prior art to provide a method by which a surface-emitting semiconductor device can be fabricated simply and at a high yield.

The above object of the present invention can be achieved by a method for fabricating a surface-emitting semiconductor device, comprising the steps of:

epitaxially growing, on a first substrate comprising a semiconductor, semiconductor layers having a semi-conductor active layer capable of emitting light upon feed of an electric current;

forming an electrode for feeding electric current to the semiconductor active layer;

bonding the first substrate on which the semiconductor layers have been formed, to a second substrate with the former's semiconductor layer side inward; and removing the first substrate from the bonded substrates so as to leave the semiconductor layers on the second substrate.

DESCRIPTION OF THE PREFERRED EMBODIMENTS

Embodiments of the present invention will be described below with reference to the accompanying drawings.
(First Embodiment)

Figure 1:
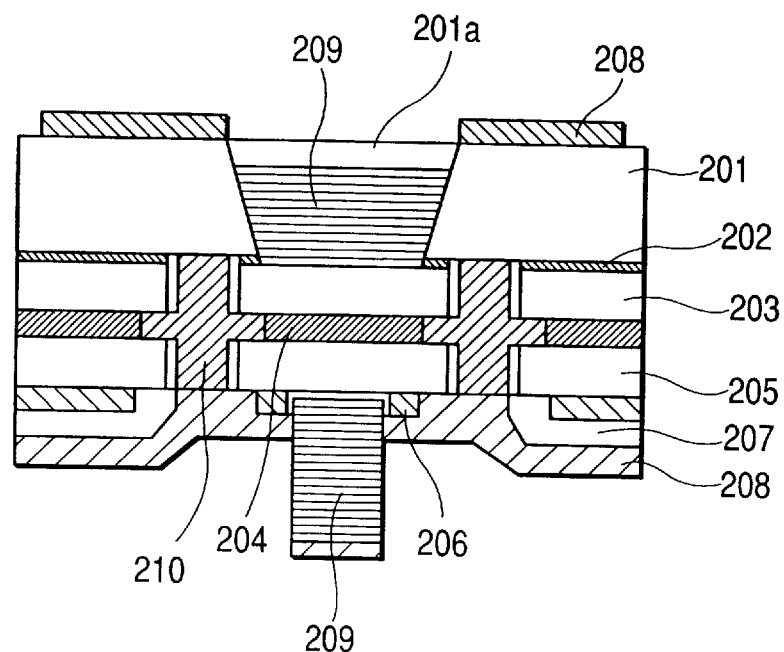
FIG. 1 is a schematic cross-sectional view showing an example of the constitution of a conventional surface-emitting semiconductor device.
Figure 2:
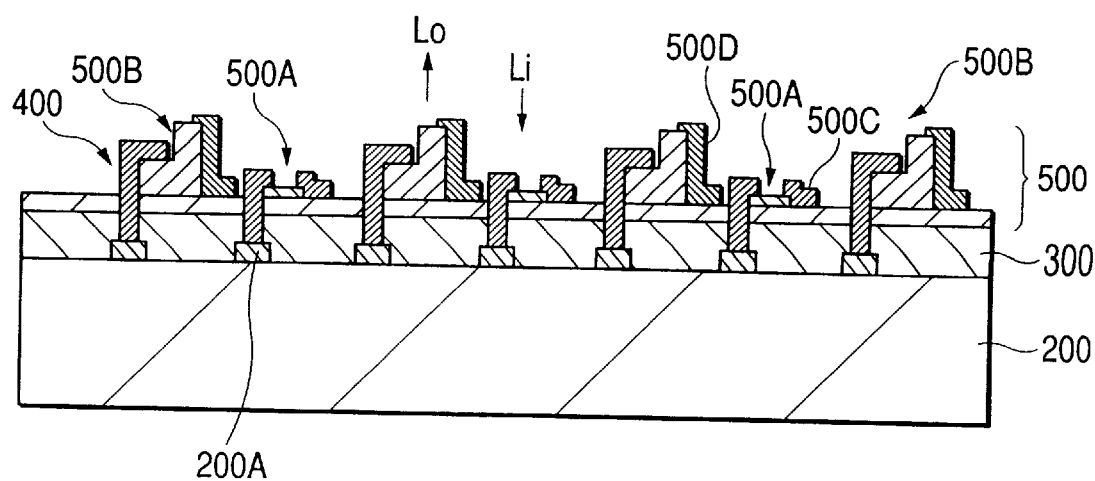
FIG. 2 is a schematic cross-sectional view showing an example of the constitution of a semiconductor device on which a surface-emitting semiconductor device and other electrical elements are integrated.
Figure 3A:
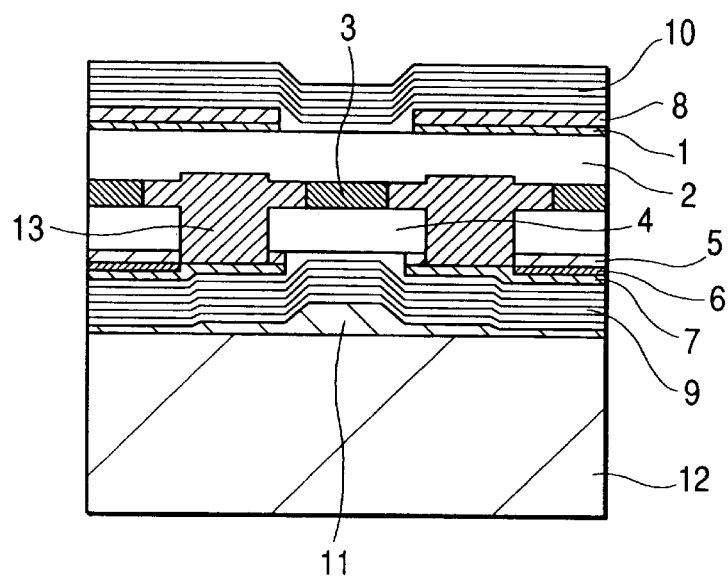
FIGS. 3A and 3B are a schematic cross-sectional view and a plan view, respectively, showing a first embodiment of the surface-emitting semiconductor device of the present invention.

A VCSEL array of a first embodiment according to the present invention is constituted of an InP substrate which is a semiconductor single-crystal substrate, and a wavelength 1.3 $\mu$m band VCSEL of an InGaAs/InGaAsP system grown on the substrate; the VCSEL being bonded to a silica glass substrate. A cross-sectional structure of the VCSEL array at its one light-emitting region (a pixel) is shown in FIG. 3A.

Figure 3B:
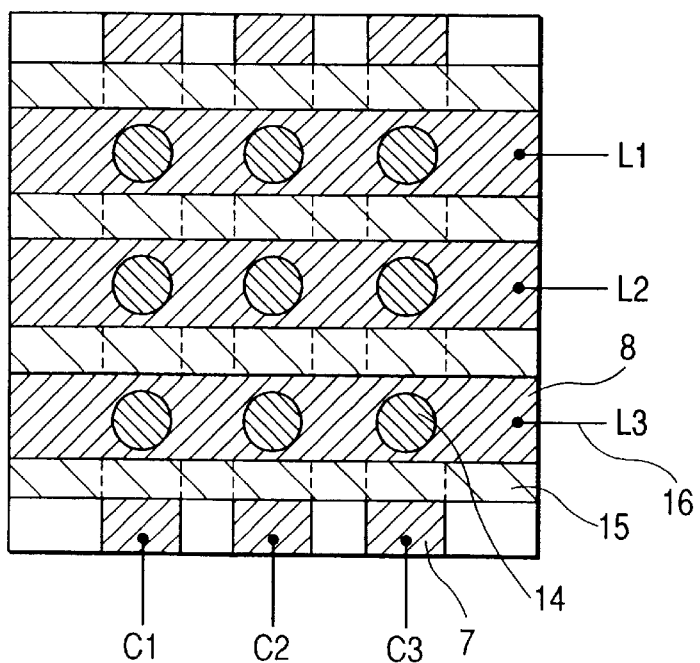

The present embodiment has a structure wherein a semiconductor active layer 3 is sandwiched between clad layers 2 and 4 comprised of n-type and p-type semiconductors, respectively, and dielectric multi-layer film mirrors 9 and 10 are formed on the both sides. The dielectric multi-layer film mirror 9 is bonded to a glass substrate 12 with an adhesive 11. The array structure as viewed on the side opposite to the glass substrate 12 has a plan view as shown in FIG. 3B. Electrodes 7 on the side of the glass substrate 12 are previously formed by patterning in stripes, and are led out by removing a semiconductor substrate bonded to the glass substrate 12 and on which an epitaxially grown layer 15 has been formed, and thereafter partly removing the epitaxially grown layer 15 to uncover the electrodes 7. Electrodes 8 on the side opposite to the glass substrate 12 are led out by partly removing the dielectric multi-layer film mirror 10. In FIG. 3B, for example, only the left uppermost pixel among pixels 14 is oscillated upon application of a voltage between Cl and L1 through electrode wires 16 (C1–C3 and L1–L3).

A fabrication method in the present embodiment will be described with reference to FIGS. 4A to 4D.

Figure 4A:
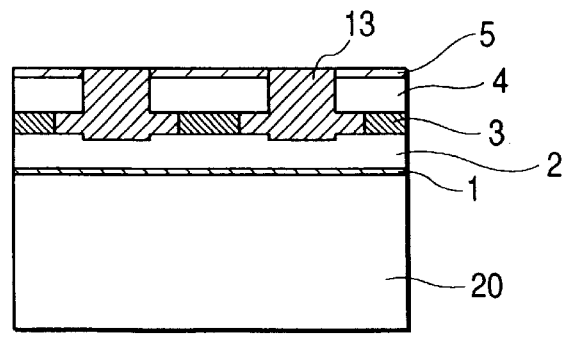
FIGS. 4A, 4B, 4C and 4D are schematic cross-sectional views for illustrating a fabrication method of the first embodiment.

First, as shown in FIG. 4A, an n-InGaAs contact and etching stop layer 1, an n-InP clad layer 2, an undoped InGaAs/InGaAsP, distorted multi-quantum-well active layer 3, a p-InP clad layer 4 and a p-InGaAs contact layer 5 are grown in this order on an n-InP substrate 20 (the first substrate) by Chemical Beam Epitaxy (CBE). Subsequently, the periphery of a light-emitting region is vertically etched in a doughnut of 20 $\mu$m in internal diameter and 40 $\mu$m in external diameter, down to the lower part of the active layer 3 by Reactive Ion Beam Etching (RIBE). Next, the side wall of the InGaAs contact layer 5 is covered with a resist and only the side wall of the active layer 3 is etched by several $\mu$m by selective wet etching to make the active layer constricted in a circle of about 15 $\mu$m diameter. This is to make the effective diameter of a dielectric multi-layer film, described later, substantially equal to the diameter of the active layer 3 so that the electric current can be made substantially narrow enough to make the motion of oscillation efficient and better (a current-narrowed structure). Here, a 3:1:1 solution of sulfuric acid, hydrogen peroxide aqueous solution and water may be used as an etchant, whereby the InP clad layers 2 and 4 are not etched at all and only the active layer 3 is selectively completely etched. Also, at the time of this etching, the (010)-plane, (001)-plane and planes reverse to these appear and the active layer 3 has a form close to a square, when a substrate having a plane-direction dependence and having (100)-plane is used as the substrate 20. In such an instance, a gain anisotropy occurs in the active layer 3 and hence the polarization of oscillated light is stabilized, so that noises such as kinks can be removed which are ascribable to unstable polarization of oscillated light and have been questioned in conventional VCSELs. Finally, the grooves produced by the selective wet etching are filled up with polyimide 13 or the like.

Figure 4B:
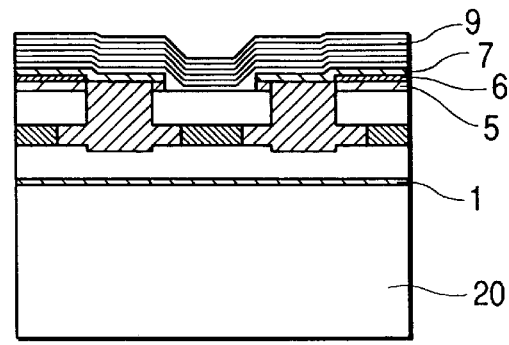

Next, as shown in FIG. 4B, an SiN film 6 is formed in order to ensure the insulation at the periphery of one pixel, and Cr(500 Å)/Au(5,000 Å) is vapor-deposited deposited as a p-side electrode 7. Inside the pixel, the electrode 7 and contact layer 5 are removed in the form of a circle with a diameter a little larger than that of the active layer 3, and a dielectric multi-layer film 9 consisting of 6 pairs of Si/Al$_2$O$_3$ each layer of which has a thickness of $\lambda$/4 ($\lambda$ is in-film actual wavelength of oscillation wavelength) is formed by RF sputtering. Here, annealing is previously made for ensuring electrode contact.

Figure 4C:
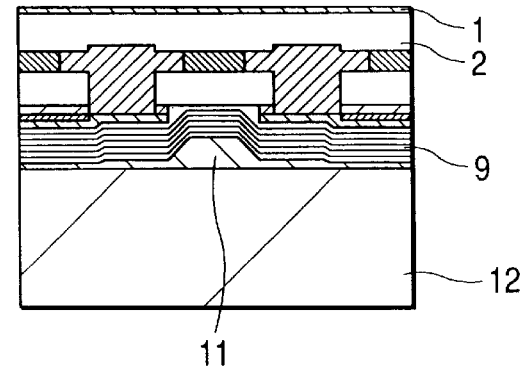

Next, as shown in FIG. 4C, the InP substrate 20 is abraded to a thickness of 100 $\mu$m, and the dielectric multi-layer film 9 side is bonded with an adhesive 11 to a glass substrate 12 (the second substrate) comprised of silica glass or the like.

Here, as the adhesive 11, an adhesive may be used which is transparent to visible light and is of the type that softens upon heating. Next, the periphery of the substrate 20 is protected and is etched away with hydrochloric acid to uncover the n-InGaAs contact and etching stop layer 1. Since the InGaAs is not etched with hydrochloric acid, the etching completely stops at the contact layer 1. The InP substrate 20 may be removed by abrasion or wet etching.

Figure 4D:
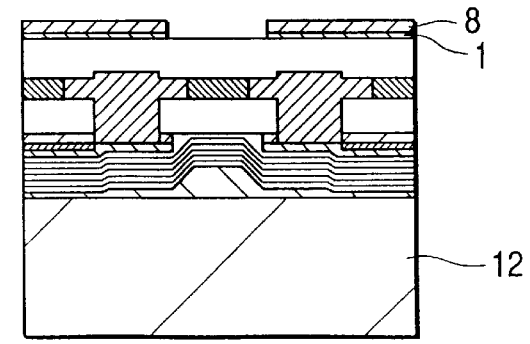

Next, as shown in FIG. 4D, AuGe(2,000 Å)/Au(3,000 Å) is vapor-deposited as an n-side electrode 8. At the pixel area, the electrode 8 and the contact layer 1 are removed in the form of a circle with a diameter a little larger than that of the active layer 3, followed by annealing for ensuring the electrode contact. Finally, a dielectric multi-layer film 10 consisting of 6 pairs of $Si/Al_2O_3$ is formed by RF sputtering. Thus, the structure as shown in FIG. 3A is completed.

Such pixels 14 may be so fabricated as to be arranged in a large number on the semiconductor substrate 20, whereby a surface-emitting type two-dimensional array laser can be made up. What is shown in FIG. 3B is a device comprised of 3×3=9 pixels 14, the number of which can be made larger. Also, the pixels may be fabricated on a plurality of semiconductor substrates so that they are bonded to a glass substrate in suitable arrangement, thus the number of the pixels can be made much larger.

In this way, the light-emitting regions (pixels) can be arranged in two-dimensional array on the original semiconductor substrate 20, and hence a surface-emitting type array device can be made up with ease. Since the semiconductor substrate 20 which is a substrate on which the layers are grown is not provided with holes conventionally made, but made flat by etching in its entirety, there can be no limitations on the distance between elements (pixels) and the yield. Compared with the direct joining of semiconductor mirrors, how to lead out electrodes must be elaborated. This is because electric currents must be fed in from the lateral side of the dielectric multi-layer film mirror 9 and the electric currents must be taken out from the lateral side of the dielectric multi-layer film mirror 10. In the present embodiment, since the substrate 12 made of glass, having no limitations on area, the device can be made large-area. Namely, although the device is usually limited by the size of the semiconductor substrate (about 3 inches in the case of compound semiconductors), epitaxially grown layers formed on semiconductor substrates may be bonded to the glass substrate, whereby the device can be made more large-area than that.

Interference of electric currents may come into question if the distance between pixels 14 is set as narrow as about 100 μm. Hence, latticed grooves may preferably be cut previously by RIBE between the pixels 14 in order to prevent such interference of electric currents. This may be done before the electrodes are attached. In that instance, the grooves may be filled up with polyimide or the like, thus the stripe pattern as shown in FIG. 3B can be formed without cut of the electrodes.

In this material system, it is difficult to effect stable and continuous oscillation unless some temperature control is made. The temperature control may be made by bringing the dielectric multi-layer film 10 side into adhesion to a heat sink made from diamond, AlN or Si. Since the mirror 10 constituted of $Si/Al_2O_3$ has a relatively high thermal conduction, it becomes possible to effect the stable and continuous oscillation. In this instance, light may be emitted from the glass substrate 12 side, the side opposite to the heat sink. Also, non-reflective coating may be applied on the glass substrate 12 so that the light output can be made larger.

Such an array laser can be applied as a two-dimensional array light source for light information processing, high speed parallel information transmission or light interconnection. Also, as will be described in an embodiment given later, the array device as described above may be formed using materials capable of emitting blue or ultraviolet light and fluorescent materials of R, G and B may be coated on the glass surface so that it can be applied as a full-color display device.

In the foregoing embodiment, the device is fabricated using the InGaAsP/InP system on the InP substrate 20. Of course, without relying on this material system, those with other wave bands can achieve the object. More specifically, the device may be applied to an AlGaN/InGaN system on a sapphire substrate and an InGaAlP/InAlP, InGaAs/AlGaAs or InGaNAs/AlGaAs(GaInP) system on a GaAs substrate. In particular, a 1.3 μm band laser constituted of the InGaNAs/AlGaAs(GaInP) system has so superior temperature characteristics and differential gain that it can be operated without temperature control and, since no heat sink is used, light can be emitted from the top-and-bottom both sides.

(Second Embodiment)

Figure 5:
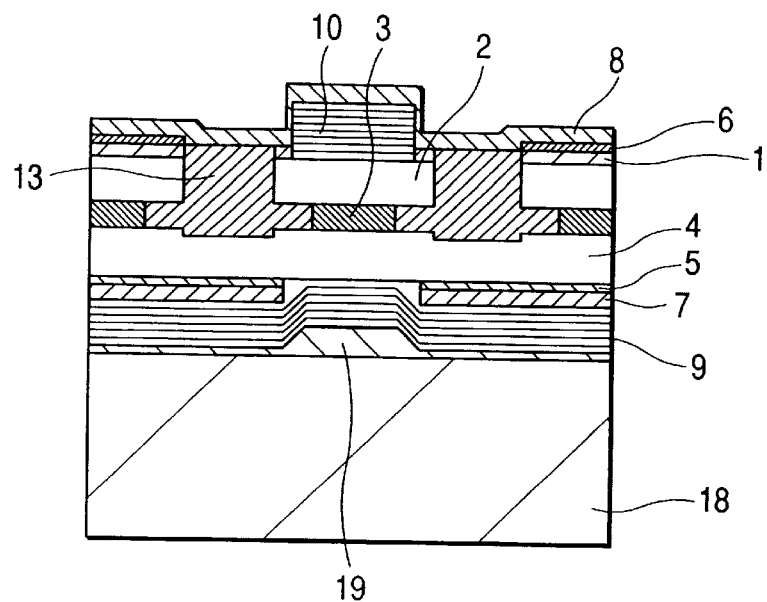
FIG. 5 is a schematic cross-sectional view showing a second embodiment of the surface-emitting semiconductor device of the present invention.

FIG. 5 is a schematic cross-sectional view showing a second embodiment of the surface-emitting semiconductor device of the present invention. In FIG. 5, the same members as those in FIG. 3A are denoted by same reference numerals, and detailed description thereon is omitted.

In the second embodiment of the present invention, pixels are formed after the first substrate has been bonded to the second substrate. Using the same constituent materials as those in the first embodiment, a wavelength 1.55 μm band VCSEL of the InGaAsP/InP system on an InP substrate (the first substrate) is made up. As the second substrate to which the first substrate is bonded, a double-side polished silicon substrate is used, which may little cause loss at the wavelength of 1.55 μm. To bond these, the final layer of the dielectric mirror is previously formed as an amorphous Si layer by sputtering, where the Si layer side is directly bonded to the surface of the silicon substrate to directly joining them while heating at 200° C. under application of a load. Accordingly, no adhesive is used. Here, if the pixels are fabricated in advance, it is difficult to join them to the silicon substrate because of influences of surface irregularities and polyimide. In order to attain a joint strength, the surfaces may be further treated at a high temperature.

The structure of the second embodiment will be described below along its fabrication method.

On the InP substrate, the laser structure is formed by epitaxial growth in the same manner as in the first embodiment (the active layer 3 is designed differently), and Ti(500 Å)/Pt(1,000 Å)/Au(3,000 Å) is formed as a non-alloy electrode 7 on an InGaAs contact layer 5, the uppermost layer. In this electrode 7, no diffusion takes place at the time of heating. Next, the electrode 7 and contact layer 5 are removed in the form of a circle with such a diameter that the effective diameter of the multi-layer film mirror 9 can be a little larger than the diameter of the active layer 3, and then the $Si/Al_2O_3$ multi-layer film mirror 9 is formed (the final layer is an Si layer). Next, as mentioned above, the Si layer side of the multi-layer film mirror 9 is joined to the silicon substrate 18. Reference numeral 19 denotes an air gap. Thereafter, after the InP substrate is removed, the method to form pixels is carried out in the same manner as in the first embodiment (e.g., the formation of doughnut-like grooves, the selective etching to constrict the diameter of the active layer 3, and the filling of the grooves with polyimide). In the device shown in FIG. 5, the electrode 8 is vapor-deposited over the whole surface for the purpose of simplifying the method, but may be formed in the manner as in the first embodiment. In such an instance, light can be emitted also from this side.

When the device is operated, the temperature may be controlled in the manner as in the first embodiment. Light may be emitted from the side of the silicon substrate 18, or may be emitted from the side on which the silicon substrate 18 is not bonded as a heat sink.

In the present embodiment, the integrated circuit fabricated on the semiconductor material silicon substrate and the optical device can be provided on the same substrate 18. Thus, an optical-electronic integrated device can be made up at a low cost.

Figure 8:
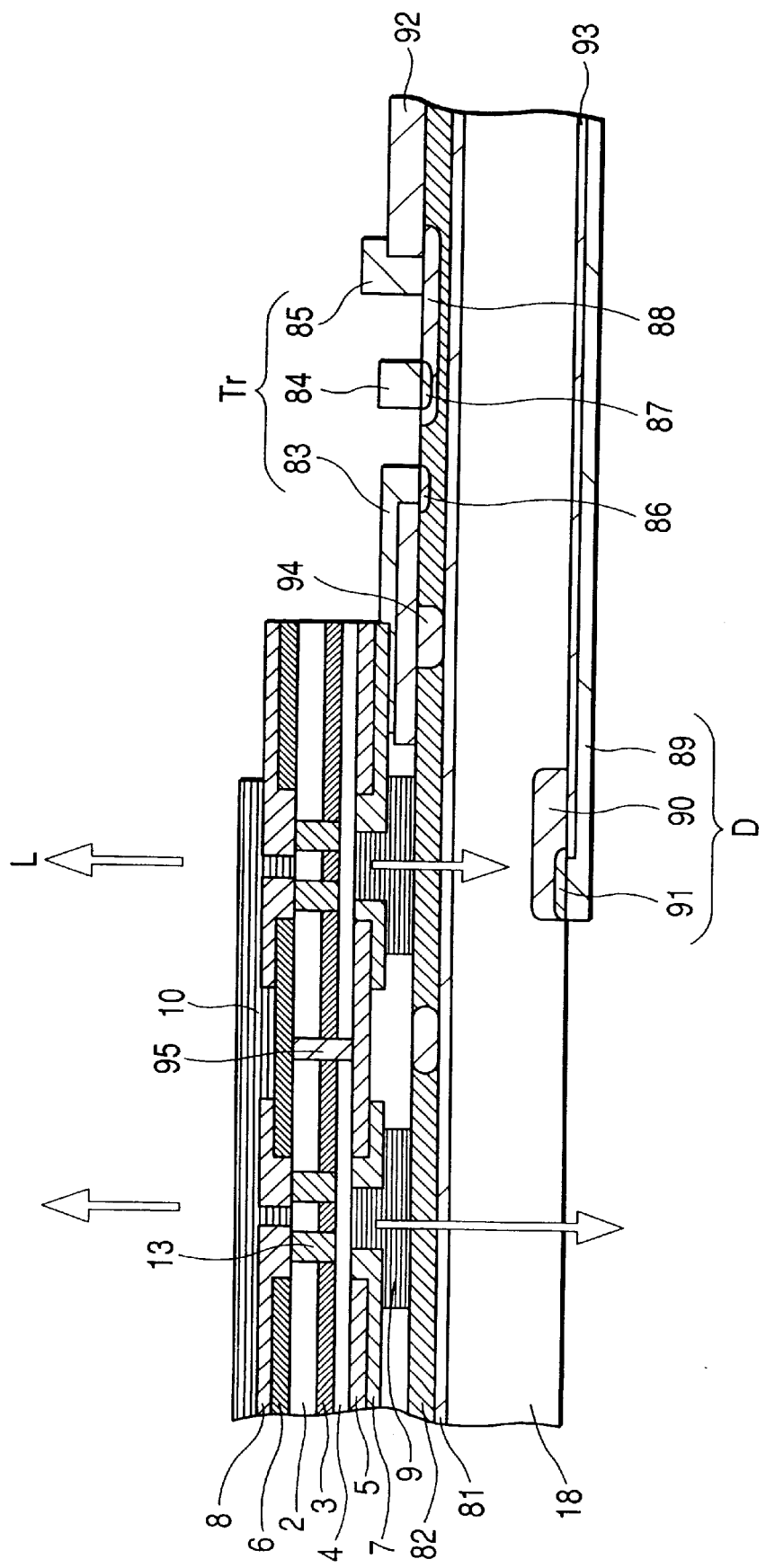
FIG. 8 is a schematic cross-sectional view showing an example of the constitution of a semiconductor device on which the surface-emitting semiconductor device of the present invention, light detectors and transistors are integrated.

An example of a semiconductor device comprising an electronic circuit integrated in this way is shown in FIG. 8. In FIG. 8, the same members as those in FIG. 5 are denoted by same reference numerals, and detailed description thereon is omitted.

In the device shown in FIG. 8, only a transistor Tr fabricated on a final-stair silicon-on-insulator (SOI) substrate in order to drive the surface-emitting laser is illustrated, and an LSI (not shown) is formed on other region of the silicon substrate 18. As shown in FIG. 8, a photodetector D is also integrated on the silicon substrate 18 on its side not bonded, where laser-light signals can be received. This is effective when the silicon substrate is transparent to laser light. A laser output L may be taken out from the side opposite to the silicon substrate 18 or may be taken out from the part where the photodetector is not provided. The surface-emitting laser shown in this drawing is a little different from the one shown in FIG. 5, in which the electrode 8 is formed beneath the dielectric mirror 10 and also windows are made so that the light can be emitted therethrough. In addition, when formed in array, electrodes are separated by a separating region 95.

The transistor Tr is an npn-type transistor wherein an electrode 83 of an n⁺-type diffused region 86 serves as a collector; an electrode 85 of a p-type diffused region 88, a base; and an electrode 84 of an n-type diffused region 87, an emitter. Reference numeral 82 denotes an n-type Si thin film on the SOI substrate; 81, an SiO₂ film of the SOI substrate; and 94, a p-type diffused region for the purpose of device separation. The collector electrode 83 of the transistor is connected with wiring 7 of the surface-emitting laser. Electrodes (not shown) other than the collector of this transistor are connected through other CMOS circuits formed on this Si device and through electric wiring formed on an insulating film 92. The other electrode 8 of the surface-emitting laser is also connected to a power source via a wiring pattern formed on the substrate. As for the photodetector D, it has a p-type diffused region 90 and an n-type diffused region 91 which are formed on the back of the SOI substrate, and is connected with other CMOS circuit through wiring 89 via an insulating film 93.

(Third Embodiment)

Figure 6:
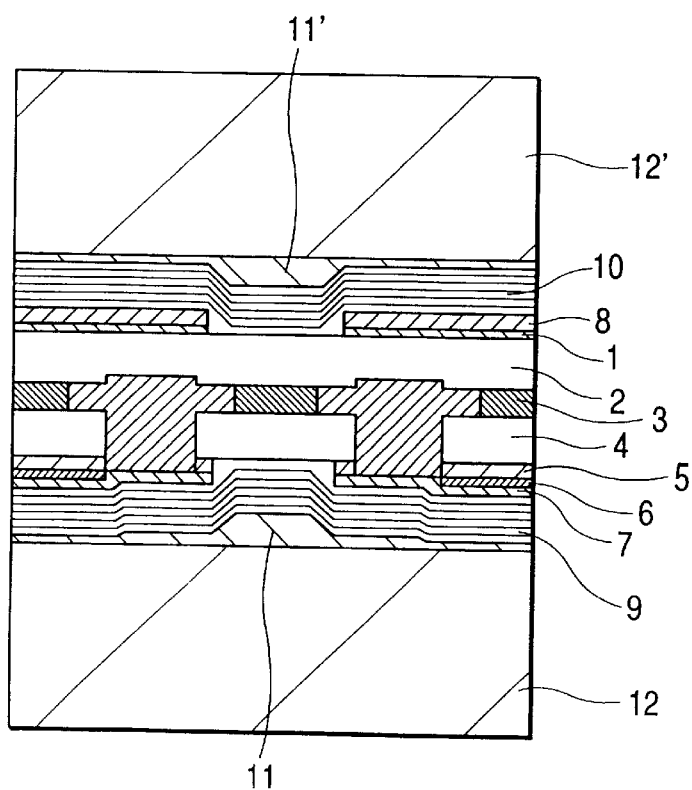
FIG. 6 is a schematic cross-sectional view showing a third embodiment of the surface-emitting semiconductor device of the present invention.

FIG. 6 is a schematic cross-sectional view showing a third embodiment of the surface-emitting semiconductor device of the present invention. In FIG. 6, the same members as those in FIG. 3A are denoted by same reference numerals, and detailed description thereon is omitted.

The present embodiment is different from the first embodiment in that a third substrate 12' is bonded onto the dielectric multi-layer film mirror 10 via an adhesive 11', and is identical to the first embodiment in other constituents. Accordingly, the surface-emitting semiconductor device of the present embodiment is fabricated in entirely the same manner as the first embodiment before the step of bonding it to the third substrate 12'.

As the above third substrate 12', like the glass substrate 12, a substrate comprised of a light-transmitting material such as glass may be used, thus the device can be a device that emits light from both sides of the active layer. A silicon substrate may also be used as the third substrate 12'. On this silicon substrate, devices such as transistors may be formed so that a semiconductor device on which the light-emitting device and other electrical devices are integrated can be obtained.

Figure 9:
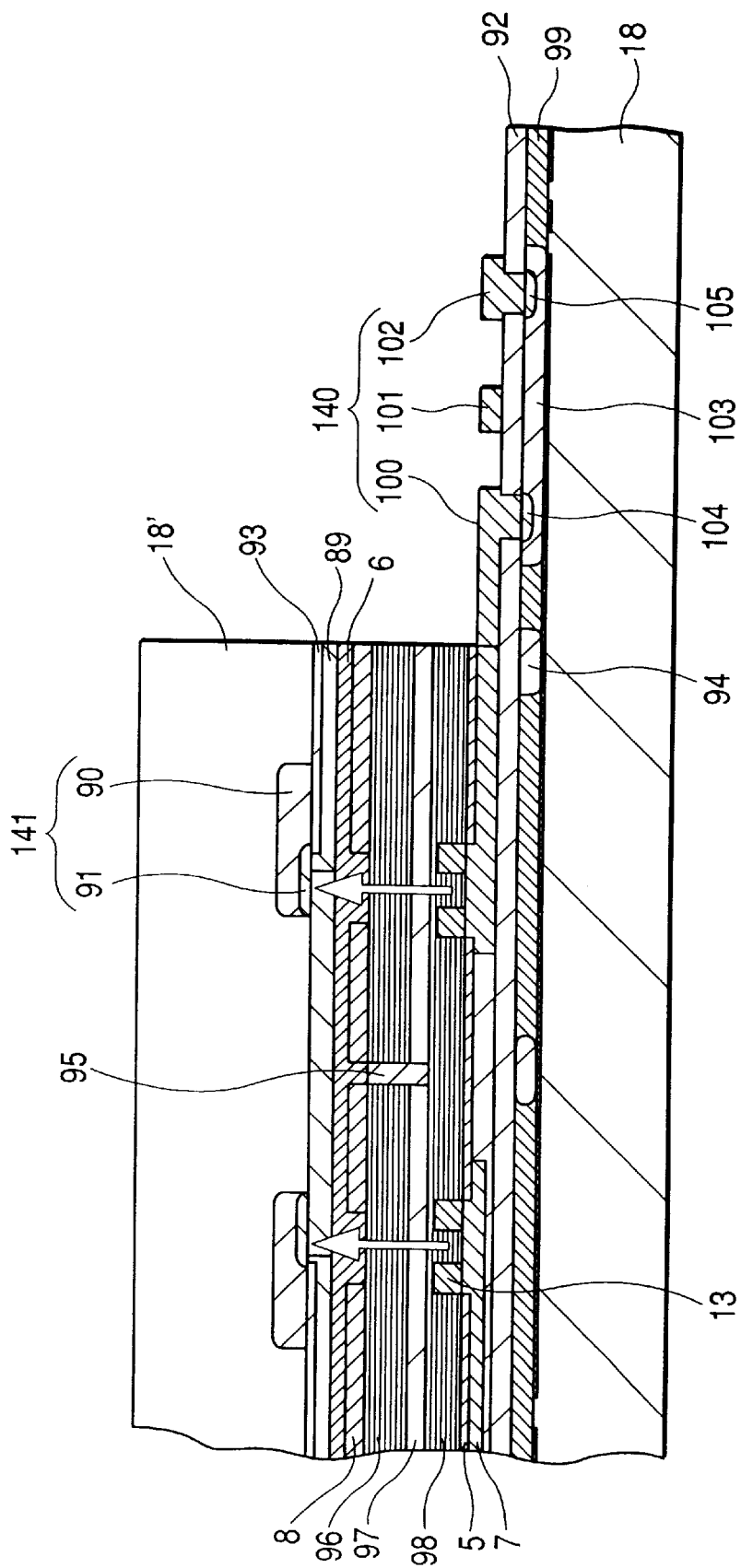
FIG. 9 is a schematic cross-sectional view showing an example of the constitution of a semiconductor device on which the surface-emitting semiconductor device of the present invention and MOS-FET are integrated.

In addition, in an instance where a silicon substrate is used as the third substrate 12' and a silicon substrate is used in place of the glass substrate 12, a semiconductor device can be made up which has a structure wherein integrated circuits fabricated on these silicon substrates are electrically isolated from each other while transmitting signals at a high speed across these integrated circuits. An example of such a semiconductor device is shown in FIG. 9. The semiconductor device shown in FIG. 9 employs GaAs system semiconductor as a constituent and the oscillating wavelength is 0.83 $\mu$m band. The active layer 97 has a multi-quantum-well structure of GaAs/AlGaAs. Distributed Bragg's Reflection (DBR) mirrors 96 and 98 comprise an epitaxial multi-layer film of AlAs/AlGaAs. In the present invention, not being limited to the above, a layer having a multi-quantum well structure of InGaAs/GaAs may be used as the active layer 97 to form the semiconductor device of oscillating wavelength of 0.98 $\mu$m band. In FIG. 9, the same members as those in FIG. 6 are denoted by same reference numerals, and detailed description thereon is omitted.

In the device shown in FIG. 9, LSIs (not shown) are formed on the SOI substrate 18 and silicon substrate 18', and an open drain type MOS-FET 140 at the final-stair n-channel is connected to the surface-emitting laser, where data signals sent from the LSIs are converted into blinking of light. The MOS-FET 140 is constituted of a p-type diffused well 103 formed in an n-type diffused layer 99 on the SOI substrate 18. Here, an electrode 101 formed via an insulating film 92 serves as a gate; an electrode 100 formed on an n-type diffused layer 104, a drain; and an electrode 102 similarly formed on an n-type diffused layer 105, a source. The drain 100 is connected with the surface-emitting laser through electrode wiring 7. On the silicon substrate 18', a photodetector 141 with which optical signals sent from the surface-emitting laser are converted into electric signals is integrated. Its output is taken in as data signals of the LSI on its substrate. This photodetector has the same structure as that shown in FIG. 8.

In this semiconductor device, the light emitted from an active layer 97 is not transmitted through the SOI substrate 18 and silicon substrate 18'. Then, the active layer 97 is sandwiched on its both sides between Distributed Bragg's Reflection (DBR) mirrors 96 and 98 formed by epitaxial growth, to constitute the surface-emitting semiconductor laser. Thus, a three-dimensionally stacked high-density integrated semiconductor device is obtained.

In all the above embodiments, the dielectric mirror is formed on a semiconductor layer epitaxially grown. Alternatively, the dielectric mirror may previously be formed on the side of a different kind of substrate made of glass or silicon, and may be bonded to the semiconductor layer. In such an instance, the mirror can be formed flatly, but gaps are made even in the epitaxially grown layer and the mirror, resulting in a large oscillator length, and also a loss such as scattering may occur to cause an increase in laser threshold electric currents.

(Fourth Embodiment)

Figure 7:
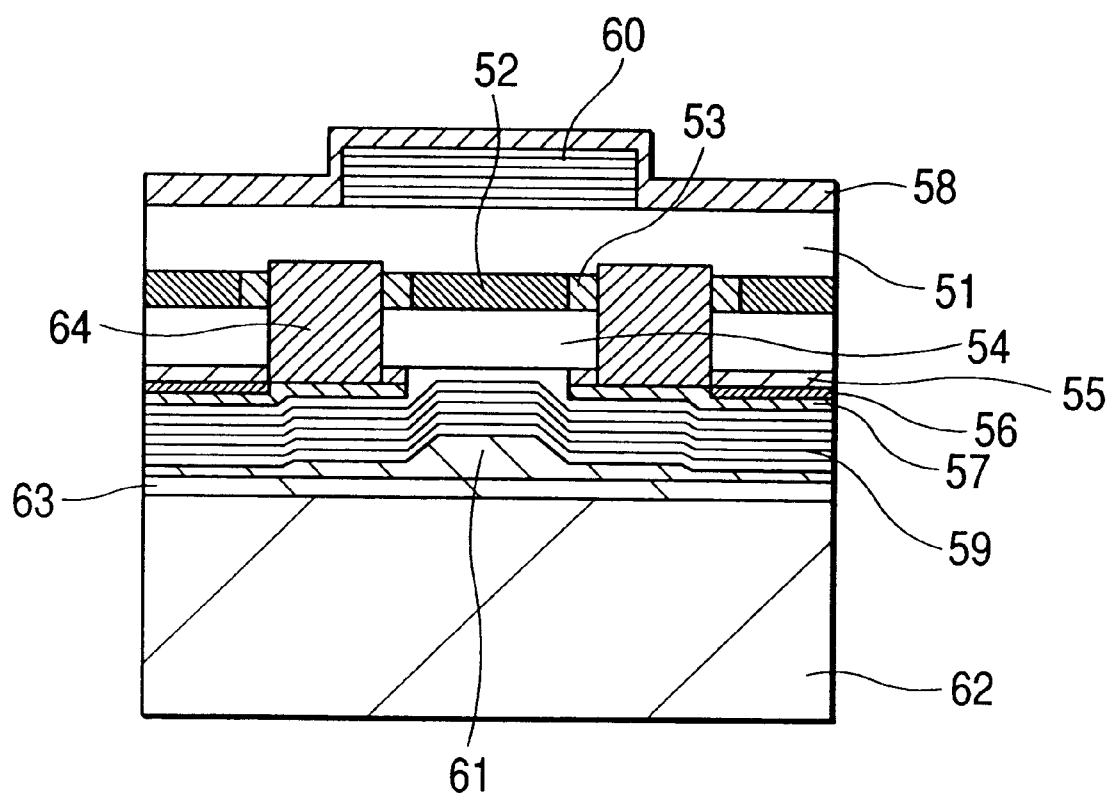
FIG. 7 is a schematic cross-sectional view showing a fourth embodiment of the surface-emitting semiconductor device of the present invention.

In a fourth embodiment according to the present invention, a laser or LED that emits blue to ultraviolet light (420 to 380 nm) by the use of a GaN material is bonded to a glass substrate as in the above embodiment so as to form a two-dimensional array. Here, as shown in FIG. 7, on the side of a glass substrate 62, a phosphor 63 capable of emitting fluorescence of R, G or B may be coated for each pixel so that the device can be applied as a full-color display device that utilizes excitation by light of blue to ultraviolet light.

As the pixels, they can be accomplished as those of 25 $\mu$m in pixel diameter and 75 $\mu$m in distance, and they can also be made to have a very large area in theory. Hence, a thin-type large-area full-color display device can be provided. A low-threshold laser is used as a light-emitting source, and hence display with a small power consumption and a high luminance can be made, bringing about advantages that any high voltage and vacuum are unnecessary.

The structure and fabrication method of the present embodiment will be described with reference to FIG. 7.

On a sapphire substrate (not shown), a GaN or an AlN low-temperature buffer layer (not shown) formed at a low growth temperature is formed in a thickness a little as large as tens of $\mu$m, and also a clad layer 51 comprised of n-GaN/n-AlGaN, a multi-quantum-well active layer 52 comprised of undoped InGaN/AlGaN, a clad layer 54 comprised of p-AlGaN/p-GaN and a p-GaN cap layer 55 are formed by Metal Organic Vapor Phase Epitaxy (MOVPE). Subsequently, in the same manner as in the first embodiment, pixels are formed by etching such as RIBE. Incidentally, it is difficult to carry out the selective etching to constrict the active layer 52. Accordingly, in the present embodiment, an electric-current blocking region 53 is formed by selective oxidation of the AlGaN layer constituting the active layer 52 and serving as a barrier layer. This utilizes the fact that a heat treatment made in an atmosphere of water vapor at about 500° C. causes oxidation to progress inward from side walls with time in the layer containing Al, which is readily oxidizable. Here, the side walls of the AlGaN layer of the clad layer 54 are simultaneously oxidized, but the cap layer 55, which is formed of GaN, does not change and no electric-current blocking region is formed. Thus, there may occur no problem. After this step, grooves are filled up with a fill-up layer 64, and thereafter Ni(1,000 Å)/Au (3,000 Å) is vapor-deposited as a p-side electrode 57. Reference numeral 56 denotes an insulating layer.

Thereafter, a dielectric multi-layer film mirror 59 comprised of 18 pairs of $SiO_2$/MgO is formed by RF sputtering, and is bonded with an adhesive 61 to a glass substrate 62 on which phosphors 63 of R, G and B have been appropriately patterned correspondingly to the pixels.

Next, the sapphire substrate is removed by abrasion or the like until the buffer layer appears. The GaN or AlN low-temperature buffer layer having thus appeared is removed by etching with phosphoric acid heated to 300° C. Here, the n-GaN layer of the clad layer 51 formed of single-crystal, epitaxially grown n-GaN/n-AlGaN has so low an etching rate to the etchant that it can be selectively etched. Finally, a dielectric multi-layer film mirror 60 comprised of $SiO_2$/MgO and, as an n-side electrode 58, Ti(500 Å)/Al(1 $\mu$m)/Au(2,000 Å) are vapor-deposited to complete the device.

Electrode patterns and electrodes may be provided in the same manner as in the first embodiment. In the case of LEDs, the dielectric mirror 59 on the side of the phosphors 63 may be omitted. In the first to third embodiments, too, the devices may be made into LED array without providing the mirror on the side from which the light is emitted.

Figure 10:
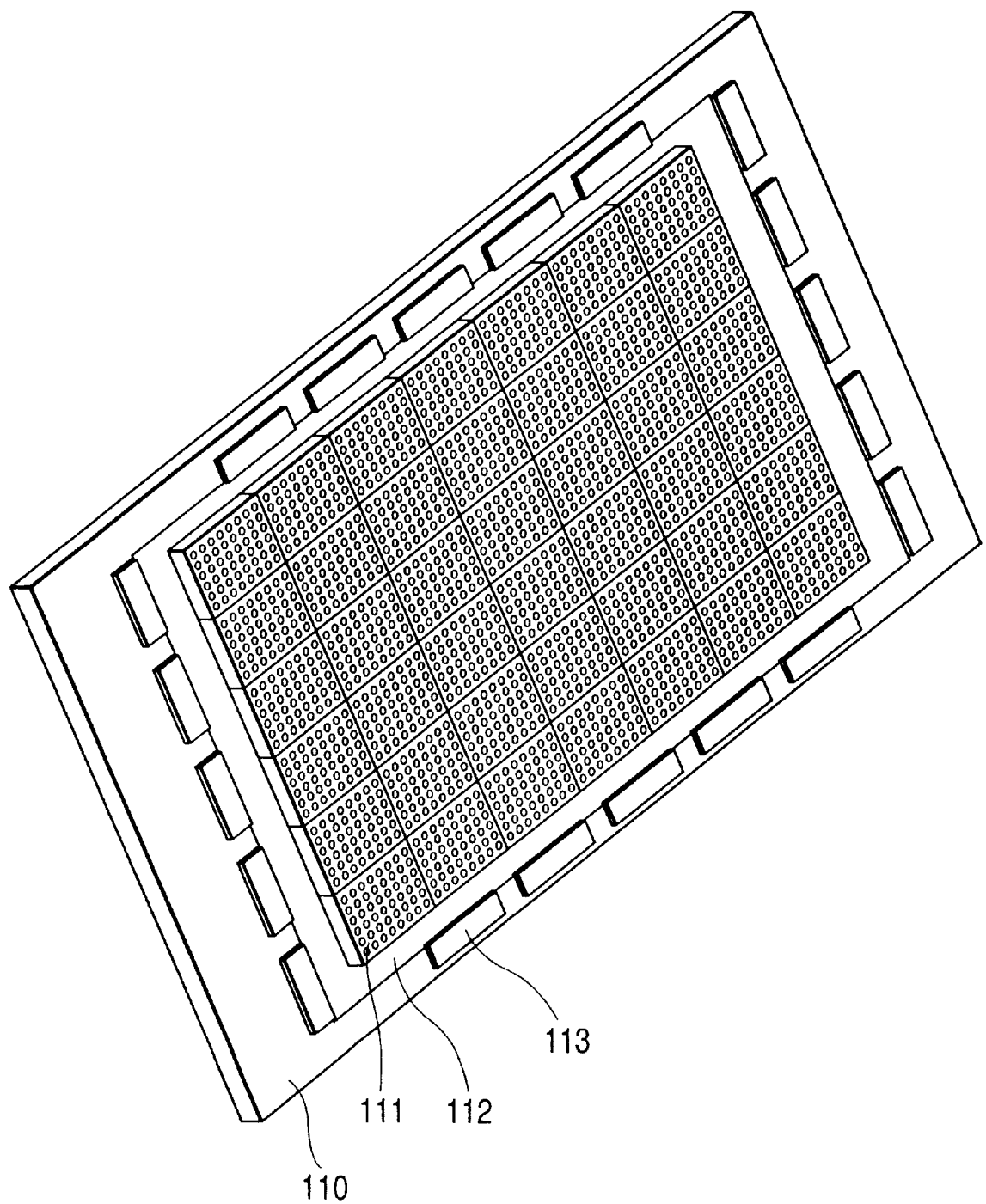
FIG. 10 is a schematic perspective view showing an example of a display device making use of the surface-emitting semiconductor device of the present invention.

An example of a full-color display device fabricated using the surface-emitting semiconductor device of the fourth embodiment shown in FIG. 7 is shown in FIG. 10. As shown in FIG. 10, GaN light-emitting devices 111 of about 60 mm square unit are arranged in plurality on a glass plate 110 for the display device to make up the device. The area depicted round in the light-emitting device corresponds to one pixel. FIG. 10 is a perspective view of a full-color flat type display device as viewed on the back. Reference numeral 112 denotes a wiring region, and 113 represents how a driver IC for lightening the pixels is mounted on the glass surface. The number of the GaN light-emitting devices illustrated in FIG. 10 is not limited to that shown in the drawing. The glass plate area may be made larger and a larger number of devices may be integrated so that the device can be adapted to a large-area device of about 60 inches.

Figure 11:
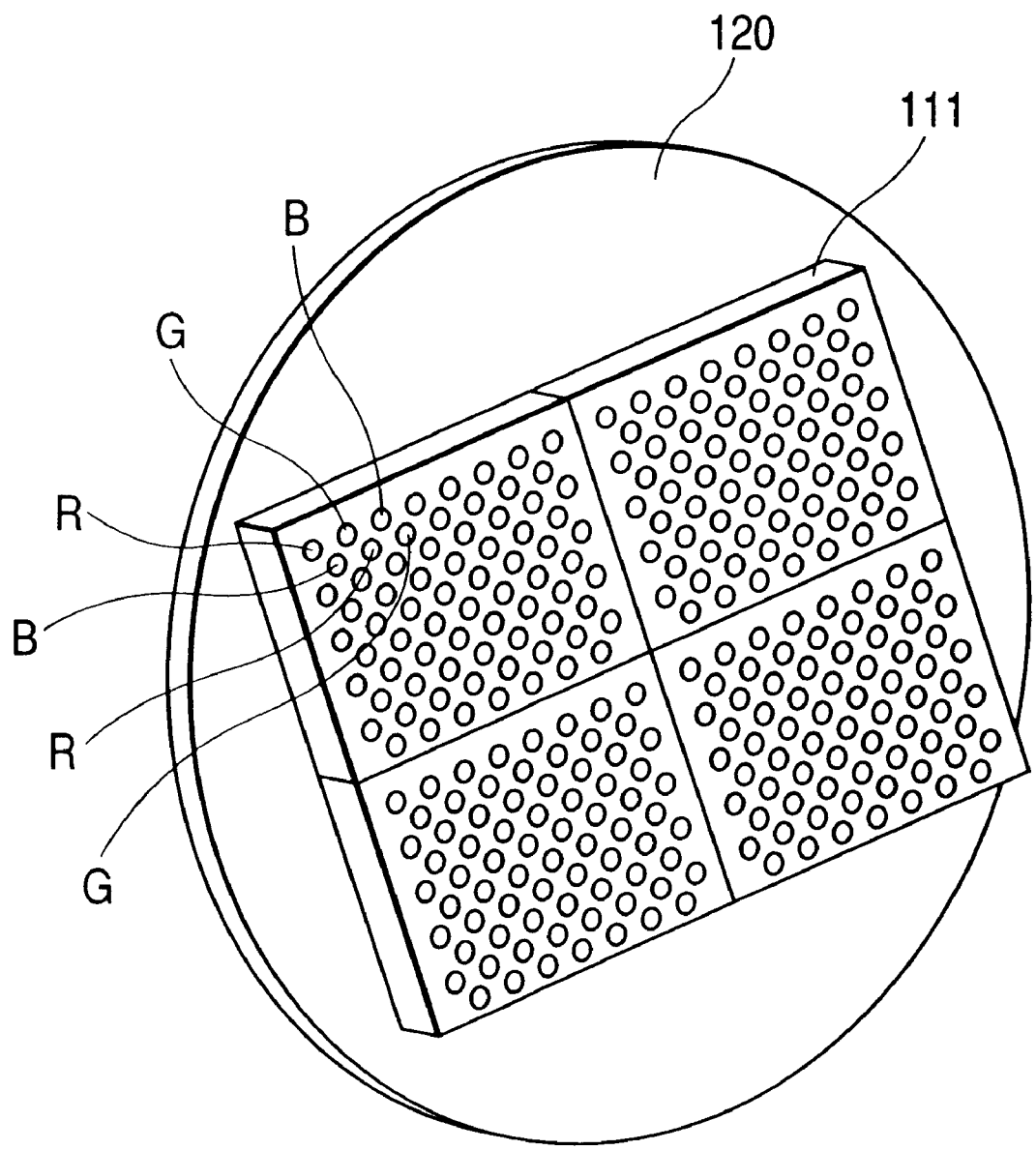
FIG. 11 is a schematic perspective view showing another example of a display device making use of the surface-emitting semiconductor device of the present invention.

As a procedure for production, first, GaN light-emitting layers may be transferred to silicon wafers integrated thereon with drive circuits, by removing GaN light-emitting layers from sapphire substrates, and these may be arranged on a glass plate coated with phosphors to make up the device. More specifically, the device has a structure wherein the GaN light-emitting layers are sandwiched between glass and silicon substrates so that the display light is emitted from the glass side. In this instance, the drive circuits can be integrated on the silicon substrates, and hence the display speed can be improved. Here, as shown in FIG. 11, some sheets of the 60 mm square GaN light-emitting devices 111 may be integrated on a silicon wafer 120 so as to be bonded in plurality to the glass plate after cutting off the peripheral portion having no pixel. Employment of such a step brings about improvements in, e.g., the readiness of alignment of pixels when devices are bonded in plurality, the readiness in processing such as abrasion and the alignment precision of wiring, bringing about an improvement in yield. FIG. 11 shows an example in which the devices are bonded to the silicon wafer 120 and the sapphire substrate is removed before they are bonded to the glass substrate, where an arrangement corresponding to RGB is illustrated. As shown in the drawing, the pixels are so made up as to stand densest and so arranged that the arrangement of RGB is in the form of a triangle and its vertex and base alternate. However, the manner of arrangement of RGB is not limited to that shown in this drawing, and the proportion of the number of pixels may be controlled in accordance with the luminance of each color.

The present invention is not limited to the embodiments described above, and can be modified in variety. The present invention embraces all such modifications so long as they do not deviate from the scope of claims.

What is claimed is:

1. A method for fabricating a surface-emitting semiconductor device, comprising the steps of:
   epitaxially growing, on a first substrate, one or more semiconductor layers, at least one of the semiconductor layers having a semiconductor active layer;
   forming a current-narrowed structure in the semiconductor active layer;
   bonding the first substrate to a second substrate such that the semiconductor layer is positioned inside; and
   transferring the semiconductor layers onto the second substrate.

2. The method according to claim 1, wherein the current-narrowed structure is formed by etching a part of the semiconductor active layer.

3. The method according to claim 1, further comprising a step of forming a mirror layer on the one or more semiconductor layers after the current-narrowed structure is formed.

4. The method according to claim 1, further comprising a step of forming an electrode on the one or more semiconductor layers after the current-narrowed structure is formed.

5. The method according to claim 3, wherein the mirror layer comprises one or more dielectric multi-layer films or one or more semiconductor multi-layer films.

6. The method according to claim 1, wherein the step of transferring is performed by polishing or etching the first substrate.

7. The method according to claim 1, wherein the second substrate comprises a light-transmitting material.

8. The method according to claim 7, further comprising a step of forming a non-reflective coating on a side opposite to the side to which the second substrate has been bonded.

9. The method according to claim 1, wherein the second substrate comprises a glass substrate.

10. The method according to claim 7, wherein the first substrate on which the one or more semiconductor layers have been formed is bonded to the second substrate through a fluorescent material interposed therebetween.

11. The method according to claim 1, wherein the second substrate comprises a semiconductor substrate an which an electronic circuit has been formed.

12. The method according to claim 3, further comprising, after the step of transferring, a step of forming a reflecting mirror on an uncovered surface of the semiconductor layers.

13. The method according to claim 11, wherein the reflecting mirror is formed by one or more dielectric multi-layer films.

14. The method according to claim 11, further comprising a step of bonding a third substrate onto the reflecting mirror.

15. The method according to claim 14, wherein the third substrate comprises a light-transmitting material.

16. The method according to claim 14, wherein the third substrate comprises a glass substrate.

17. The method according to claim 14, wherein the third substrate comprises a semiconductor substrate on which an electronic circuit has been formed.

18. The method according to claim 4, wherein the electrode comprises a positive electrode and a negative electrode which are arranged in a matrix configuration.

19. The method according to claim 1, wherein the epitaxially growing step includes epitaxially growing, on each of a plurality of first substrates, one or more semiconductor layers, at least one of those semiconductor layers having a semiconductor active layer, the bonding step includes bonding the plurality of first substrates to the second substrate in an array configuration, and the transferring step includes transferring the semiconductors layers from the first substrates to the second substrate.

20. The method according to claim 1, wherein the semiconductor layers have the current-narrowed structure for restricting the flow of electric current fed to the semiconductor active layer.

21. The method according to claim 1, wherein the semiconductor layers comprise a compound semiconductor of any one of B, Al, Ga and In with N.

22. The method according to claim 1, wherein the semiconductor active layer comprises ZnO and a clad layer comprising ZnMgO.

23. A surface-emitting semiconductor device fabricated by the method according to claim 1.

24. A display device comprising a plurality of surface-emitting semiconductor devices that are arranged in an array configuration and individually fabricated by the method according to claim 1.

* * * * *

UNITED STATES PATENT AND TRADEMARK OFFICE
CERTIFICATE OF CORRECTION

PATENT NO. : 6,261,859 B1 Page 1 of 1
DATED : July 17, 2001
INVENTOR(S) : Toshihiko Ouchi It is certified that error appears in the above-identified patent and that said Letters Patent is hereby corrected as shown below:

Title page,
Item [56], References Cited, OTHER PUBLICATIONS, "inGaAs/GaAIAs" should read -- InGaAs/GaAIAs --.

Column 2,
Line 5, "can not" should read -- cannot --;
Line 19, "a=:" should be deleted;
Line 20, "can not" should read -- cannot --;
Line 24, "can not" should read -- cannot --;
Line 25, "much" should be deleted;
Line 26, "can not" should read -- cannot --; and
Line 46, "light-" should read -- a light --.

Column 4,
Line 55, "deposited (second occurrence)" should be deleted.

Column 5,
Line 24, "arrangement," should read -- arrangement; --; and
Line 40, "made" should read -- is made --.

Column 10,
Line 5, "60" should not be boldface; and
Line 6, "unit" should read -- units --.

Column 11,
Line 25, "an which" should read -- on which --;
Line 30, "claim 11," should read -- claim 12, --; and
Line 33, "claim 11," should read -- claim 12, --.

Signed and Sealed this

Twenty-fourth Day of December, 2002

JAMES E. ROGAN
*Director of the United States Patent and Trademark Office*